US006533587B1

(12) United States Patent
Potter et al.

(10) Patent No.: US 6,533,587 B1
(45) Date of Patent: Mar. 18, 2003

(54) CIRCUIT BOARD RISER

(75) Inventors: David Potter, Acton, MA (US); Jerry Jarvis, South Weymouth, MA (US); Robert Wiley, Topsfield, MA (US)

(73) Assignee: Network Engines, Inc., Canton, MA (US)

(*) Notice: Subject to any disclaimer, the term of this patent is extended or adjusted under 35 U.S.C. 154(b) by 0 days.

(21) Appl. No.: 09/899,522

(22) Filed: Jul. 5, 2001

Related U.S. Application Data

(60) Provisional application No. 60/215,995, filed on Jul. 5, 2000, provisional application No. 60/215,952, filed on Jul. 5, 2000, provisional application No. 60/215,975, filed on Jul. 5, 2000, provisional application No. 60/215,997, filed on Jul. 5, 2000, provisional application No. 60/215,996, filed on Jul. 5, 2000, provisional application No. 60/216,055, filed on Jul. 5, 2000, provisional application No. 60/244,354, filed on Oct. 30, 2000, and provisional application No. 60/244,361, filed on Oct. 30, 2000.

(51) Int. Cl.[7] ................................................ H01R 12/00

(52) U.S. Cl. ............................ 439/65; 439/61; 361/788

(58) Field of Search ............................. 439/65, 62, 59, 439/61; 361/788, 790, 785, 803, 684, 686

(56) References Cited

U.S. PATENT DOCUMENTS

| | | | | | |
|---|---|---|---|---|---|
| 3,406,368 | A | * | 10/1968 | Curran | 361/787 |
| 3,437,882 | A | * | 4/1969 | Cayzer | 174/254 |
| 3,550,062 | A | * | 12/1970 | Drenten et al. | 361/776 |
| 4,432,604 | A | * | 2/1984 | Schwab | 385/60 |
| 4,573,753 | A | * | 3/1986 | Vogl | 29/857 |
| 4,823,233 | A | * | 4/1989 | Brown et al. | 361/692 |
| 4,838,798 | A | * | 6/1989 | Evans et al. | 439/493 |
| 5,002,493 | A | * | 3/1991 | Brown et al. | 29/848 |
| 5,017,146 | A | * | 5/1991 | Uehara et al. | 439/60 |
| 5,190,462 | A | * | 3/1993 | Lauchner et al. | 361/805 |
| 5,266,036 | A | * | 11/1993 | Lichtenwalter et al. | 174/35 GC |
| 5,455,742 | A | * | 10/1995 | Phoy et al. | 174/250 |
| 5,525,763 | A | * | 6/1996 | Van Liere | 174/260 |
| 5,648,891 | A | * | 7/1997 | Gierut | 361/740 |
| 5,706,179 | A | * | 1/1998 | Palatov | 361/726 |
| 5,896,473 | A | * | 4/1999 | Kaspari | 385/139 |
| 6,116,934 | A | * | 9/2000 | Longueville | 439/260 |
| 6,202,110 | B1 | * | 3/2001 | Coteus et al. | 361/684 |
| 6,203,380 | B1 | * | 3/2001 | Harting et al. | 439/293 |
| 6,261,104 | B1 | * | 7/2001 | Leman, Michael V. | 439/61 |
| 6,335,867 | B1 | * | 1/2002 | Ishibashi et al. | 174/261 |
| 6,336,814 | B1 | * | 1/2002 | Kusyk et al. | 439/61 |
| 6,361,343 | B1 | * | 3/2002 | Daskalakis et al. | 439/237 |
| 6,388,895 | B1 | * | 5/2002 | Hsu | 361/772 |
| 6,392,142 | B1 | * | 5/2002 | Uzuka et al. | 174/52.1 |

* cited by examiner

*Primary Examiner*—Tho D. Ta
*Assistant Examiner*—Edwin A. León
(74) *Attorney, Agent, or Firm*—David J. Powsner; Nutter McClennen & Fish LLP

(57) ABSTRACT

A riser card, such as a peripheral component interconnect (PCI) card, attaches to a circuit board such as a mother board in a transverse orientation and has a first connector and a second connector attached to opposing sides of the card for receiving expansion cards. In one embodiment, the first connector is offset from the second connector with respect to an axis in the plane of the riser card. In another embodiment, the first and second connectors each have a first and last pin, and the first pin of the first card is opposite the first pin of the second connector. The riser card may mount one expansion board right side up, and the second board upside down. The first and second connectors can be female connectors which are each matable with a male connector on the corresponding expansion board, or can be card edge connectors. The expansion boards, when mated with the connectors, are substantially parallel to, but offset from the circuit board. Advantageously, the expansion boards consume less space in the housing by sharing a single riser card, and overall bus length may be substantially reduced between components in addition to providing additional, more open, or better channel space for cooling air flow. A preferred embodiment mounts centrally on a mother board, and provides two side channels for air flow cooling through the chassis of a rack-mounted web server data processor device.

12 Claims, 3 Drawing Sheets

30 32 37 37 35 38 36a 35 36b 34

CIRCUIT BOARD RISER

CROSS-REFERENCE TO RELATED APPLICATIONS

This application claims priority from earlier filed U.S. provisional patent application Ser. No. 60/215,995, filed Jul. 5, 2000, which is incorporated herein by reference.

This application is related to the following abandoned, commonly assigned applications, the teachings of all of which are incorporated herein by reference: U.S. Ser. No. 60/215,952, filed Jul. 5, 2000, entitled "Server Architecture and Methods for Digital Data Processing," U.S. Ser. No. 60/215,975, filed Jul. 5, 2000, entitled "Low Profile, High Density Storage Array," U.S. Ser. No. 60/215,997, filed Jul. 5, 2000, entitled "Ventilating Slide Rail Mount," U.S. Ser. No. 60/215,996, filed Jul. 5, 2000, entitled "Power Supply for Low Profile Equipment Housing," U.S. Ser. No. 60/216,055, filed Jul. 5, 2000, entitled "Low Profile Equipment Housing with Angular Fan," U.S. Ser. No. 60/244,354, filed Oct. 30, 2000, entitled "Ventilating Slide Rail Mount," and U.S. Ser. No. 60/244,361, filed Oct. 30, 2000, entitled "Low Profile, High Density Storage Array."

BACKGROUND OF THE INVENTION

The present invention relates to system boards for a computer, and in particular, to riser cards that connect to the system board and accept adapters that are plugged into the riser card instead of the system board.

Heating is a constant and significant issue to be addressed in digital data processors. The failure rates of many electronic components increase as operating temperatures rise. This is particularly true of central processing units which, themselves, often generate significant heat. The problem is compounded by the use of more densely packed circuit boards, more compact, lower profile housings, more densely packed components within a chassis, and faster processing chips or higher speed processor devices.

Most often, processors and associated components are cooled by airflow. Fans are typically used to push or pull air from one side of a chassis, across the components, and out the other side of the chassis. Thus, for example, a typical digital data processor includes chassis intake and/or exhaust fans, often with a fan on the central processing unit itself. While the steps of simply providing intake and exhaust fans on a chassis or housing wall, and of providing one or more device fans on critical components, have proven adequate to date, obtaining sufficient circulation for adequate heat dissipation requires careful design, and the limits of achievable cooling are taxed as even more powerful processors, and/or more compact or constricted systems are built.

The expansion capabilities of a typical digital data processing unit give rise to additional air flow problems. For example, peripheral component interconnect (PCI) cards, which connect directly into a digital data processor circuit board, or motherboard, allow additional components, e.g. expansion boards, to be installed within the unit. These additional components occupy regions that would otherwise be open to circulation, and create a more densely packed arrangement of components, which further prevents the flow of air. Often, because of path length restrictions, the additional expansion boards must be positioned at specific locations, which are not necessarily conducive to proper circulation.

One area of particular concern arises for web servers and for specialized digital data processing apparatus, such as storage arrays used in web servers, wherein tens or hundreds of closely packed substantially identical cards or devices such as CD ROM units may be mounted in small or constricted spaces, e.g., in a chassis mounted in a rack or cabinet. By way of example, a single closed box-like chassis may have ten or more CD ROM devices with their associated control cards and one or more power supplies, and each chassis may mount like a slide in drawer into a rack holding ten or more such chassis stacked in a column. These chassis have a standard width (e.g. 19 inches) and a standardized height (1U, 2U or 3U), with the thinnest of such units having a height barely 2 inches tall. Such assemblies present extreme challenges for efficient layout of internal busses and components, and for providing adequate cooling in the restricted space allotted to each multi-device chassis in the array.

Accordingly, there is a need to provide for more powerful, and/or more compact systems with air ventilation paths.

One object of the present invention is to provide an improved digital data processor apparatus and method.

A more particular object is to provide such apparatus and methods as are particularly adapted to web servers and other data processing apparatus that are compact of design and/or not prone to overheating.

A still further object is to provide such apparatus and methods as can be implemented at low cost.

A still further object of the invention is to provide such apparatus and methods as can be adapted to pre-existing equipment, as well as designed for use in new equipment.

SUMMARY OF THE INVENTION

One or more of the foregoing objects are achieved in accordance with the present invention which provides, in one aspect, a PCI riser card that connects to a circuit board and has a first and a second connector attached to opposing sides of the card for each connecting, respectively, to a first and a second expansion board.

In one embodiment, the first connector is inverted with respect to the second connector. The first and second connectors can be female connectors that are each matable with a corresponding male connector mounted, for example, on an expansion board. Alternatively, the connectors may be male pin connectors, or may be of two opposite types. Preferably, however, both connectors are of the same type and are configured for connecting two identical expansion boards. The first connector can be offset from the second connector. The expansion boards, when mated with their corresponding connectors, are substantially parallel to the circuit board. The first expansion board can be inverted (i.e., upside down) with respect to the second expansion board.

The riser card of the present invention is advantageous in that the mounting of two expansion boards consumes less space than in the prior art since only one riser card is required per two expansion boards. This provides additional space for air flow to travel.

In another aspect of the present invention, a module such as a circuit board is disposed in a chassis, and an expansion slot is mounted on the circuit board and adapted for receiving a riser card. The riser card mounts in the expansion slot, and has a first connector and a second connector attached to opposing sides of the card that receive respective expansion boards, which extend in opposite directions from the riser card and parallel to the circuit board. The expansion slot may be disposed centrally on the circuit board to define shortened bus paths to the two expansion boards. The mounting geometry also defines two air flow channels along two sides of the board.

BRIEF DESCRIPTION OF THE DRAWINGS

The invention will be more fully understood from the following detailed description taken in conjunction with the accompanying drawings, in which.

DETAILED DESCRIPTION OF THE DRAWINGS

Figure 1:
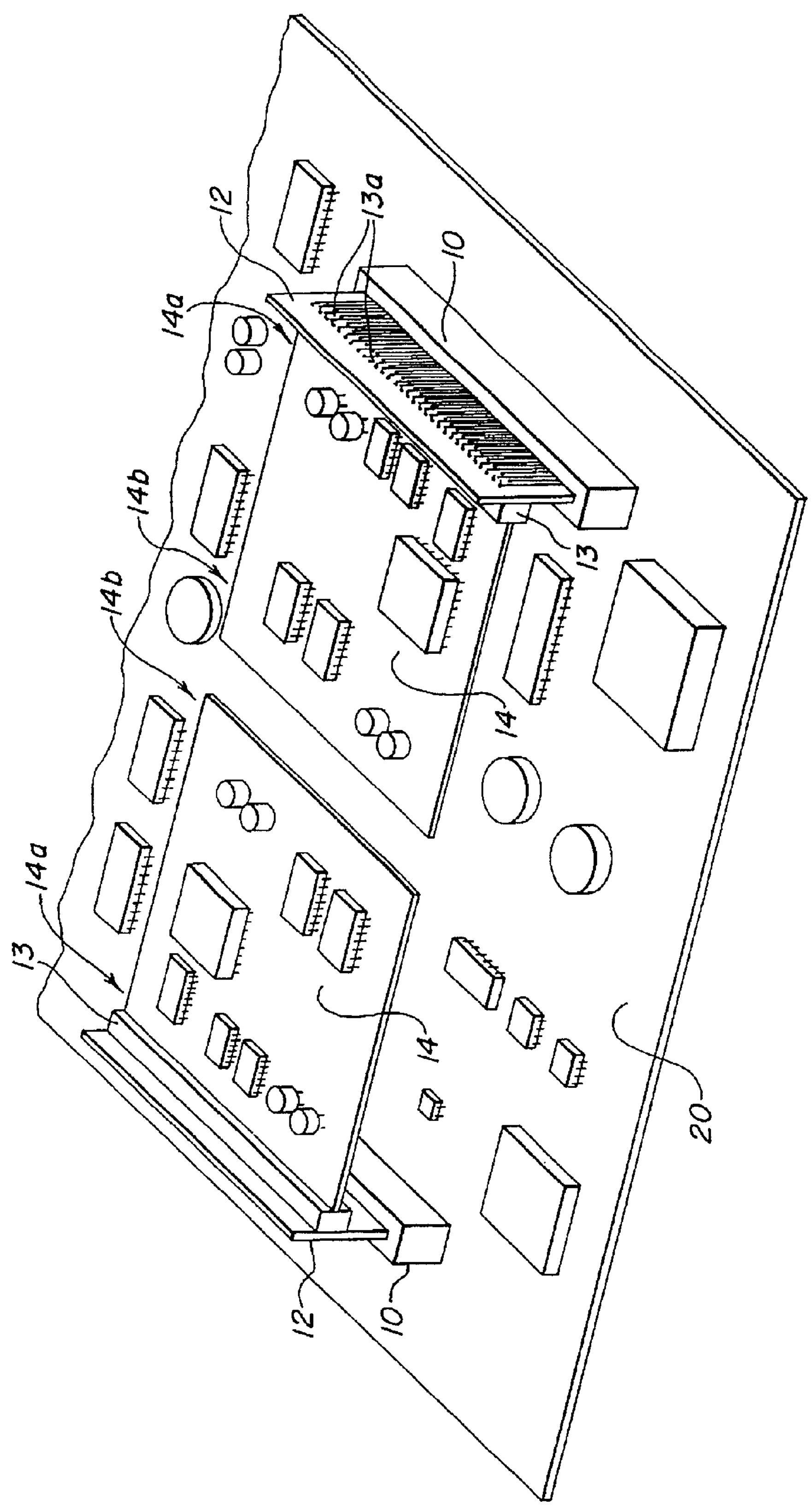
FIG. 1 shows a prior art riser card disposed on a circuit board.

The present invention will be better understood in the context of the prior art, of which FIG. 1 shows a representative device. As shown therein, a motherboard or other circuit board 20 is adapted to receive an expansion board 14 by means of a riser card 12 that connects to a connector or socket 10 mounted on the board 20, so that the riser card 12 extends perpendicularly upward from the surface of the motherboard. The riser card 12 in turn carries a connector or socket 13 mounted on its surface into which the expansion board 14 fits. Typically the connector 13 is electrically connected to the riser card 10 by a plurality of pins 13*a* (visible on the right side of FIG. 1) which are solder-connected to corresponding vias (not shown) on the riser card 12 that extend down into corresponding connections in the mounting connector 10. Thus, in this prior art construction the vias of riser card 12 serve as electrical connection between the pin connections of the board-receiving socket 13 and the pin connections of the motherboard socket 10, allowing the expansion boards 14 to be each oriented in a plane parallel to the motherboard, i.e., horizontally in the Figure as shown. Thus, rather than mounting the expansion board perpendicularly as commonly done in digital processing devices having relatively large chassis that may accommodate a voluminous arrangement of components, the prior art riser card 12 mounts perpendicularly on a motherboard 20 to position an expansion board parallel to, but slightly above the motherboard.

As shown, with this configuration, each board has a proximal end 14*a* that carries a connector (if pin connectors are used) or that fits within the connector 13 on the riser board (if a card edge connector is used), and has a distal end 14*b* at the opposite end of its generally rectangular shape. It will be appreciated that as a result of this geometry, the prior art mounting has the effect of placing the end 14*b* of one card 14 at an extreme distance from the distal end 14*b* of the other card. Specifically, if information or data must be transferred from a chip or device at one end of the expansion board, it must travel along vias for the full length of the expansion board, down the riser board to the motherboard 20, and along similar vias or paths on the motherboard for twice the full length of the expansion board, and up the other riser board to the distal end of the second expansion board, resulting in a lengthy PCI bus length. Moreover, the geometry illustrated in FIG. 1 results in rather bulky projections, namely one motherboard connector 10 and one riser board connector 13, projecting over the mother board 20 for each expansion board 14 mounted in the chassis.

Figure 2:
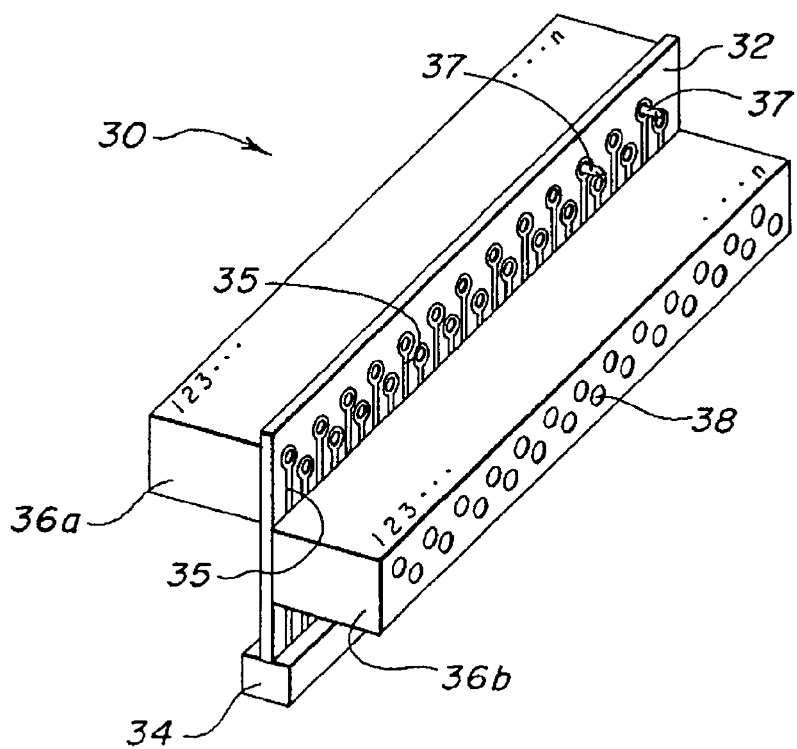
FIG. 2 shows a riser card in accordance with the present invention.

FIG. 2 illustrates a riser card 30 for a PCI expansion board in accordance with the present invention. As shown, the riser card 30 include a circuit card 32, and first and second board connectors 36*a*, 36*b* mounted on opposite sides of the card 32. Each of the connectors 36*a*, 36*b* may be identical to the connectors 13 described above for the prior art. That is, these may be card edge connectors, male multipin connectors or female multipin socket connectors. The connector 36*b* illustrated in FIG. 2 is a socket connector having a plurality of pin receiving sockets 38 adapted to receive pins of a corresponding pin connector (not shown) mounted on an expansion card. As illustrated in FIG. 2, the connector 36*a* is a conventional connector having a plurality of conductive mounting leads or pins 37 of which several are illustrated projecting through the riser card 32, arranged in regular ranks and soldered to the vias 35 that run in parallel along the length (vertically as shown) of the riser card 32.

Connector 36*b* similarly connects to the same vias, or to similar vias identically located on the opposite side of the board, or such vias or lands connected by through-connects to the same vias. Persons familiar with board and connector fabrication will realize that the vias or lands 35 provided on opposite sides of the riser card 32 need not be directly interconnected, but many connect only through common contacts in the motherboard socket, or through circuits or conductors on the motherboard itself.

In one preferred embodiment for use in a web server application, the riser card 30 is intended to mount two expansion boards of essentially identical type so that pins number 1, 2, 3 . . . n of connector 36*a* are positioned directly opposite to the identically numbered pins 1,2,3 . . . n of connector 36*b*. FIG. 2 further illustrates the riser card 32 connected to a connector 34. As discussed for the other illustrated connectors, connector 34 may be a card edge connector that has its pins soldered to the mother board 20 and simply receives the card 32 directly in a slot extending along its length to establish electrical connections between lands on the card 32 and vias on the board 20. In this case, the card itself has no connector, and the connector 34 is part of the motherboard. Alternatively, connector 34 may be a plug or socket type connector that is affixed to the card 32 and removably attaches to a mating socket or plug-type connector mounted on the motherboard 20. For clarity of illustration, only a single connector 34 is shown, rather than a pair of mating elements.

Figure 3:
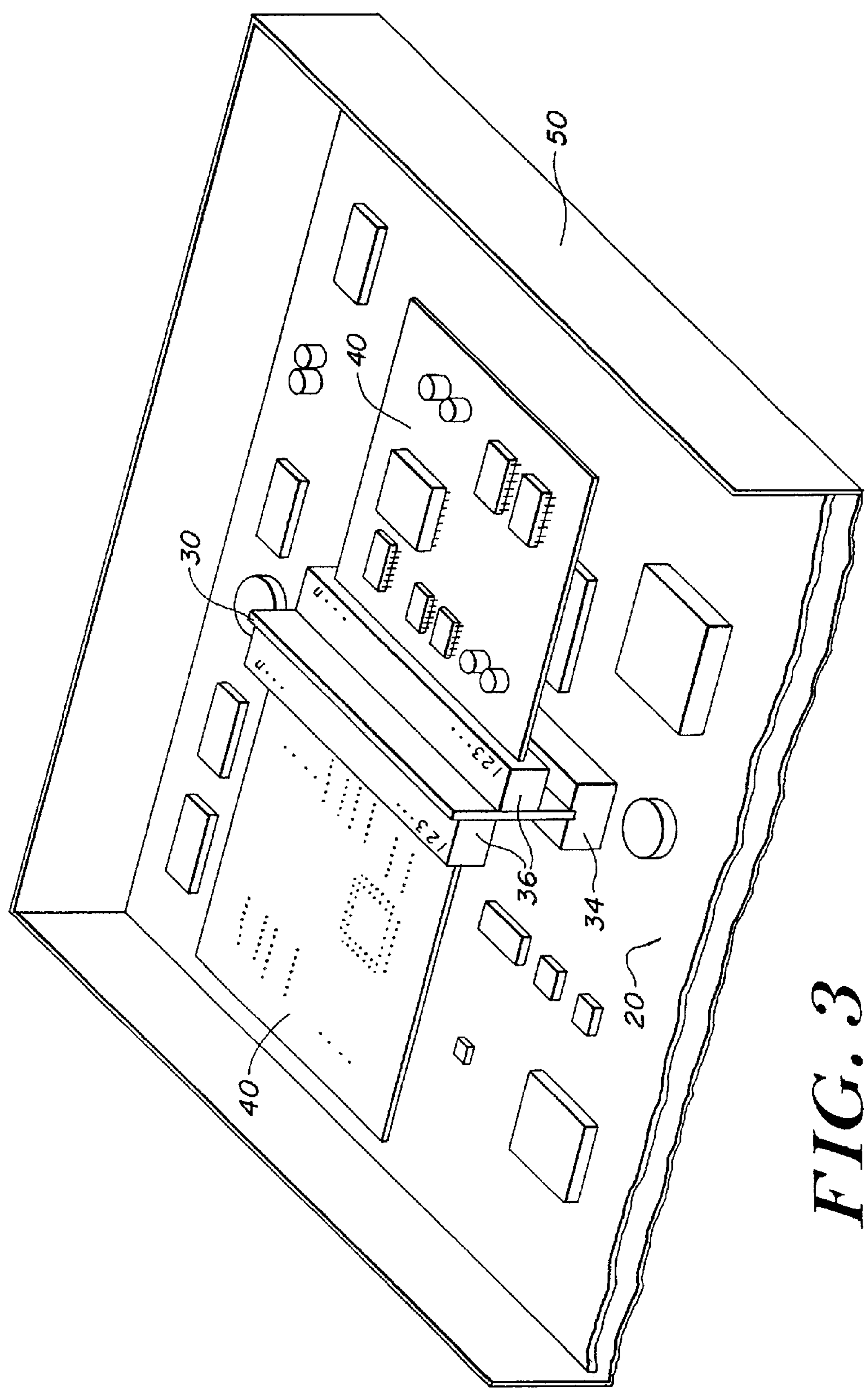
FIG. 3 shows a riser card in accordance with the present invention disposed on a circuit board and having expansion boards attached thereto.

FIG. 3 illustrates a riser card 30 of the present invention mounted on a motherboard 20 and carrying two PCI expansion boards 40. In the illustrated embodiment, the motherboard 20 is mounted on a slide-in or other rack mounted chassis 50 such as a 1U rack mount chassis. Further, the connector 34 is soldered to the motherboard 20 and the riser board 30 is simply a card with vias extending to lands at its lower edge that slide into a slot in the connector 34. Card 30 carries two similar board edge connectors 36 each of which is provided with a slot for receiving an expansion board 40 directly therein. As shown for the embodiment of FIG. 2, the pin numbers run from 1 to n on both cards in the front-to-back direction. That is, pin 1 of one connector is directly opposite to pin 1 of the other connector.

As a result, when identical expansion boards are attached via the riser 30, one board, illustratively on the left in FIG. 3, has its component side facing down, while the other board, illustratively on the right, is oriented right side up, i.e., with its components mounted on the upwardly-facing side of the board. Advantageously, the two connectors 36 are spaced at different heights, and the one located at highest above the motherboard and nearest to the top of the chassis has its components facing downwardly. Conversely, the one illustratively on the right that is located furthest below the top of the chassis has its components extending upwardly. When the chassis has relatively little height, and/or is a covered chassis, this opposed connector arrangement allows the riser card and boards to occupy no greater height than occupied by the more space-consuming conventional riser card arrangement shown in FIG. 1. Moreover, even if the height and space are not an issue in a given chassis 50, it will be seen that the riser card 30 arranges the two expansion boards 40 such that no two components on the expansion boards 40 are spaced more than two card widths plus the riser lengths apart from each other, or apart from any component on the motherboard.

Thus, the PCI bus interconnecting the various devices is substantially shorter between any two components, and for components located on opposite boards is approximately half as long as in the conventional configuration. It will be appreciated that although FIG. 3 illustrates circuit elements on only one side of the expansion board, similar considerations apply when the expansion boards 40 contain various circuit elements on both sides of the board. However, typically all components will be arranged on one side of an expansion board 40.

The configuration shown in FIG. 3 also has the expansion boards mounted on a riser located at the center line of the motherboard 20 rather than on riser cards located at both edges of the motherboard 20. This is partly responsible for the reduced PCI bus lengths mentioned above. Advantageously, the riser card 30 also permits the arrangement of expansion boards 40 such that unobstructed air flow channels may be provided down both the left and the right side (as viewed in the front-to-back direction of FIG. 3) of the chassis 50. Thus, for example, in a configuration for a web server, ventilation fans may be provided at the front and/or back of chassis 50 to maintain a more direct air over all the boards within the chassis due to the increased open space and well define flow channels. For example, by positioning one or more fans on the front panel of the chassis 50 on each of the left and right sides, separate uninterrupted air flows may be maintained down the left and the right sides toward the rear of the chassis. This provides highly channeled but unobstructed flows for effective heat dissipation or cooling.

Various commonly-owned inventive methods and apparatus have been developed to enhance heat dissipation or cooling mechanisms in densely arrayed web server equipment, and these provide a range of architectures and constructions to which the the present invention is advantageously applied. For example, commonly assigned, U.S. patent application Ser. No. 60/216,055 filed Jul. 5, 2000, entitled "Low Profile Equipment Housing with Angular Fan" provides an angled fan disposed within a chassis for integrating the region around a component into the airflow pattern. Other apparatus and methods include a ventilated slide rail which facilitates the flow of air throughout the chassis which (see copending, commonly assigned, U.S. patent application Ser. No. 60/215,997, filed Jul. 5, 2000, and Ser. No. 60/244,354, filed Oct. 30, 2000, both entitled "Ventilating Slide Rail Mount."). A third commonly owned invention is a high density storage array having a plurality of digital data storage devices and supporting elements for supporting the storage devices and for providing additional airflow space (see commonly assigned, U.S. patent application Ser. No. 60/215,975 filed Jul. 5, 2000, and Ser. No. 60/244,361, filed Oct. 30, 2000, both entitled "Low Profile, High Density Storage Array"). Another is an equipment housing offering improved physical layout and circuit connections (see commonly assigned, U.S. patent application Ser. No. 60/215,996 filed Jul. 5, 2000, entitled "Power Supply for Low Profile Equipment Housing"). Another commonly owned U.S. patent application, Ser. No. 60/215,952, filed Jul. 5, 2000, entitled "Server Architecture and Methods for Digital Data Processing," describes a unique architecture for server systems and the monitoring of physical or utilization status. Each of the foregoing constructions is advantageously employed in a system of the present invention and the invention described in greater detail herein further provides additional cooling benefits in the chassis, allowing for the cooling of such densely packed, and more compact systems, and is compatible with, or extends each of the above inventions, the patent applications of which are all hereby incorporated by reference.

It will further be appreciated that by arranging the two expansion board connectors 36 to have corresponding pins positioned directly opposite each other on the card 30, the bus path length from one expansion card to the other is no greater than the distance between the two connectors 36 so that data may be transferred between the two boards directly without depending on the motherboard PCI bus when the expansion board I/O circuitry permits such communications.

Thus it will be seen that the riser card of the present invention provides great efficiencies both in space utilization, layout for ventilation and design, and bus communications between components. It thus diminishes several critical limitations affecting the processor or data transfer speeds, and directly addresses the circuit density and space requirements of digital processing devices such as web server and network devices. The invention being thus disclosed, one skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A riser card comprising:

a substantially rigid card matable at an edge thereof with a connector on a board so as to connect normal to the board, the card having a plurality of vias for carrying signals, the plurality of vias including at least a first via and a last via;

a first connector and a second connector matable with a first and second expansion card, respectively, each connector having at least a first pin that is coupled to the first via and a last pin that is coupled to the last via;

the first and second connectors disposed on opposing faces of the rigid card such that at least the first pin of the first connector is disposed directly opposite the first pin of the second connector and the last pin of the first connector is disposed directly opposite the last pin of the second connector.

2. The riser card of claim 1, wherein the first and second connectors are female connectors.

3. The riser card of claim 1, wherein the substantially rigid card defines a plane, the first connector being offset from the second connector along an axis in the plane.

4. The riser card of claim 3, wherein the first and second connectors are oriented to receive identical first and second expansion boards facing in opposite directions along the axis.

5. A digital data processing system, comprising, a circuit board;

an edge card connector on the circuit board;

a substantially rigid structure matable with the edge card connector, the structure having a plurality of vias for carrying signals, the plurality of vias including at least a first via and a last via; and a first connector and a second connector matable with a first and a second expansion card, respectively, each connector having at least a first pin that is coupled to the first via and a last pin that is coupled to the last via;

the first and second connectors disposed on opposing faces of the substantially rigid structure such that at least the first pin of the first connector is disposed directly opposite the first pin of the second connector and the last pin of the first connector is disposed directly opposite the last pin of the second connector;

wherein the substantially rigid structure when mated with the edge card connector, is substantially perpendicular to the circuit board.

6. The digital data processing system of claim 5, wherein the substantially rigid structure defines an axis, the first connector being offset from the second connector along the axis.

7. The digital data processing system of claim 5, wherein the first and second connectors are female connectors.

8. The digital data processing system of claim 5, wherein the first and second expansion boards are substantially planar to the circuit board.

9. A digital data processing apparatus comprising a chassis, a module disposed within the chassis, an expansion slot attached to the module, a riser card attached to the expansion slot, the riser card having a plurality of vias for carrying signals, the plurality of vias including at least a first via and a last via, the riser card having a first and second connector matable with a first and second expansion card, respectively, each connector having at least a first pin that is coupled to the first via and a last pin that is coupled to the last via, the first and second connectors disposed on opposing faces of the riser card such that at least the first pin of the first connector is disposed directly opposite the first pin of the second connector and the last pin of the first connector is disposed directly opposite the last pin of the second connector.

10. The digital data processing apparatus of claim 9, wherein the substantially riser card defines an axis, the first connector being offset from the second connector along the axis.

11. The digital data processing apparatus of claim 9, wherein the first and second connectors are female connectors.

12. The digital data processing apparatus of claim 9, wherein the first and second expansion boards are substantially parallel to the module.

* * * * *